United States Patent
Solomko et al.

(10) Patent No.: US 9,319,006 B2
(45) Date of Patent: Apr. 19, 2016

(54) SYSTEM AND METHOD FOR A RADIO FREQUENCY COUPLER

(71) Applicant: Infineon Technologies AG, Neubiberg (DE)

(72) Inventors: Valentyn Solomko, Munich (DE); Winfried Bakalski, Munich (DE); Nikolay Ilkov, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 94 days.

(21) Appl. No.: 14/043,496

(22) Filed: Oct. 1, 2013

(65) Prior Publication Data

US 2015/0091668 A1    Apr. 2, 2015

(51) Int. Cl.
| | |
|---|---|
| *H01P 5/18* | (2006.01) |
| *H03F 1/56* | (2006.01) |
| *H03F 3/195* | (2006.01) |
| *H03F 3/68* | (2006.01) |
| *H03F 3/60* | (2006.01) |
| *H03F 1/02* | (2006.01) |
| *H03H 11/36* | (2006.01) |
| *H03H 11/00* | (2006.01) |
| *H03H 7/24* | (2006.01) |

(52) U.S. Cl.
CPC .. *H03F 1/56* (2013.01); *H01P 5/18* (2013.01); *H03F 1/0261* (2013.01); *H03F 3/195* (2013.01); *H03F 3/602* (2013.01); *H03F 3/68* (2013.01); *H03H 11/36* (2013.01); *H03F 2200/198* (2013.01); *H03F 2200/255* (2013.01); *H03F 2200/451* (2013.01); *H03H 7/24* (2013.01)

(58) Field of Classification Search
CPC .................................. H01P 5/18; H01P 5/184
USPC .................. 333/109, 110, 111, 112, 117, 124
See application file for complete search history.

(56) References Cited

U.S. PATENT DOCUMENTS

| | | | | |
|---|---|---|---|---|
| 6,029,051 | A * | 2/2000 | Osterberg | G01R 27/28 324/142 |
| 6,034,554 | A | 3/2000 | Francis et al. | |
| 6,329,880 | B2 * | 12/2001 | Akiya | 330/207 P |
| 6,600,307 | B2 * | 7/2003 | Turski | G01R 21/12 324/95 |
| 6,803,818 | B2 * | 10/2004 | van Amerom | H03G 3/3042 330/144 |
| 6,879,918 | B2 * | 4/2005 | Daoud | G01R 27/04 702/65 |
| 7,190,934 | B2 * | 3/2007 | Kataoka | H03G 3/3042 330/298 |

(Continued)

FOREIGN PATENT DOCUMENTS

| | | | |
|---|---|---|---|
| DE | 102010040290 A1 | 3/2011 | |
| DE | 102010009104 A1 * | 8/2011 | G01R 27/06 |

(Continued)

OTHER PUBLICATIONS

"Directional Couplers," Microwave Encyclopedia, Microwaves101.com, Updated May 12, 2013, 5 pages.

(Continued)

*Primary Examiner* — Dean Takaoka
(74) *Attorney, Agent, or Firm* — Slater & Matsil, L.L.P.

(57) ABSTRACT

In accordance with an embodiment, a directional coupler includes a coupler circuit and at least one amplifier coupled between a coupler circuit isolated port and a directional coupler isolated port and/or between a coupler circuit coupled port and a directional coupler coupled port. In various embodiments, the directional coupler is disposed over and/or in a substrate.

24 Claims, 8 Drawing Sheets

(56) References Cited

U.S. PATENT DOCUMENTS

| | | | |
|---|---|---|---|
| 7,359,681 B2* | 4/2008 | Cho | H04B 1/0458 455/107 |
| 7,375,603 B2* | 5/2008 | Dupont et al. | 333/24 R |
| 7,440,731 B2* | 10/2008 | Staudinger | H03F 1/0205 455/126 |
| 7,576,626 B2 | 8/2009 | Gorbachov | |
| 7,821,273 B2* | 10/2010 | Van Bezooijen et al. | 324/646 |
| 7,907,032 B2 | 3/2011 | Yamamoto et al. | |
| 8,326,234 B2 | 12/2012 | Bakalski et al. | |
| 8,606,198 B1* | 12/2013 | Wright | 455/120 |
| 8,830,110 B1 | 9/2014 | Choi et al. | |
| 8,907,702 B1 | 12/2014 | Solomko et al. | |
| 2002/0000866 A1* | 1/2002 | Weiss | H03G 3/3047 327/494 |
| 2002/0067786 A1 | 6/2002 | Tomofuji et al. | |
| 2002/0113601 A1 | 8/2002 | Swank, II | |
| 2002/0127990 A1* | 9/2002 | Bollenbeck | H03G 3/3047 455/293 |
| 2009/0128255 A1* | 5/2009 | Dupont | H01P 5/18 333/109 |
| 2009/0302959 A1* | 12/2009 | Belot et al. | 331/107 SL |
| 2010/0019983 A1* | 1/2010 | Bonnet et al. | 343/861 |
| 2010/0022203 A1* | 1/2010 | Bonnet et al. | 455/84 |
| 2011/0199100 A1* | 8/2011 | Charley et al. | 324/649 |
| 2012/0001693 A1* | 1/2012 | Magoon | H03G 3/3047 330/278 |
| 2013/0038387 A1* | 2/2013 | Schmidhammer | G01R 27/06 327/563 |
| 2013/0147535 A1 | 6/2013 | Hur et al. | |
| 2015/0002146 A1 | 1/2015 | Solomko et al. | |
| 2015/0035545 A1* | 2/2015 | Langer | H04W 52/226 324/629 |
| 2015/0219701 A1 | 8/2015 | Solomko | |

FOREIGN PATENT DOCUMENTS

| | | |
|---|---|---|
| DE | 102013212862 A1 | 1/2014 |
| JP | 2003525455 A | 8/2003 |

OTHER PUBLICATIONS

Bahl, "Chapter 12 Lumped-Element Circuits," Artechhouse, Jun. 7, 2003, 42 pages.

Dehaene, W. et al., "A 100 MHz Highly Accurate CMOS Zero-Phase Detector for Timing Recovery Systems," ESSCIRC, Sep. 19-21, 1995, pp. 258-261.

Rubin, "A Wide-Band UHF Logarithmic Amplifier," IEEE Journal of Solid-State Circuits, vol. SC-1, No. 2, Dec. 1966, pp. 74-81.

Tang et al., "S-Band Full 360° High Precision Phase Detector," Proceedings of APMC 2012, Dec. 4-7, 2012, pp. 97-99.

* cited by examiner

SYSTEM AND METHOD FOR A RADIO FREQUENCY COUPLER

TECHNICAL FIELD

The present disclosure relates generally to an electronic device, and more particularly to a system and method for a radio frequency (RF) coupler.

BACKGROUND

Directional couplers, which are electronic devices that can detect power being transmitted in a particular direction, are used in a wide variety of radio frequency (RF) circuits. For example, a directional coupler may be used in a radar system to detect a reflected wave by separating the indecent wave from the reflected wave, or may be used in a circuit that measures the impedance mismatch of transmission lines. Functionally, a directional coupler has a forward transmission path and a coupled transmission path. The forward transmission path generally has a low loss, while the coupled transmission path couples a fraction of the transmission power that is propagated in a particular direction. There are many different types of coupler architectures that include electromagnetic couples and magnetic couplers. Each of these coupler types may be implemented using different topologies and materials depending on the frequency of operation and the operational environment.

Generally, the directivity of a directional coupler is sensitive to the termination at the coupled and isolated ports. For example, if the impedance of the termination varies with frequency, the directivity of the directional coupler may also vary with frequency. The variation of impedance with frequency may be due to parasitic capacitances/inductances present at the termination ports. The impedance of the termination may also deviate from the expected value due to random variations or temperature variations. One way this issue has been conventionally addressed is by using a dual-directional coupler having two directional couplers connected in series.

SUMMARY OF THE INVENTION

In accordance with an embodiment, a directional coupler includes a coupler circuit and at least one amplifier coupled between a coupler circuit isolated port and a directional coupler isolated port and/or between a coupler circuit coupled port and a directional coupler coupled port. In various embodiments, the directional coupler is disposed over and/or in a substrate.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a directional coupler that may be used in RF circuits to measure incident or reflected power. The invention may also be applied to other systems and applications including other circuits that make RF measurements including, but not limited to devices that measure and/or tune impedance mismatch, time domain reflectometers (TDR), sensing devices for use with tunable antenna matching circuits, and tunable filters.

In an embodiment of the present invention, a directional coupler and termination impedances for the coupled and isolated ports of the directional coupler are disposed on the same substrate, such as a semiconductor substrate, along with one or more amplifiers that buffer the coupled and/or isolated ports. In some embodiments, using the on-substrate termination and amplifiers reduce the sensitivity of the directivity of the coupler to off-substrate loads and parasitics. The amplifiers may have an adjustable gain and/or a tunable network may be coupled between the outputs of the coupled and/or isolated ports and the one or more amplifiers in order to provide attenuation and/or to tune the coupling performance of the directional coupler.

Figure 1A:
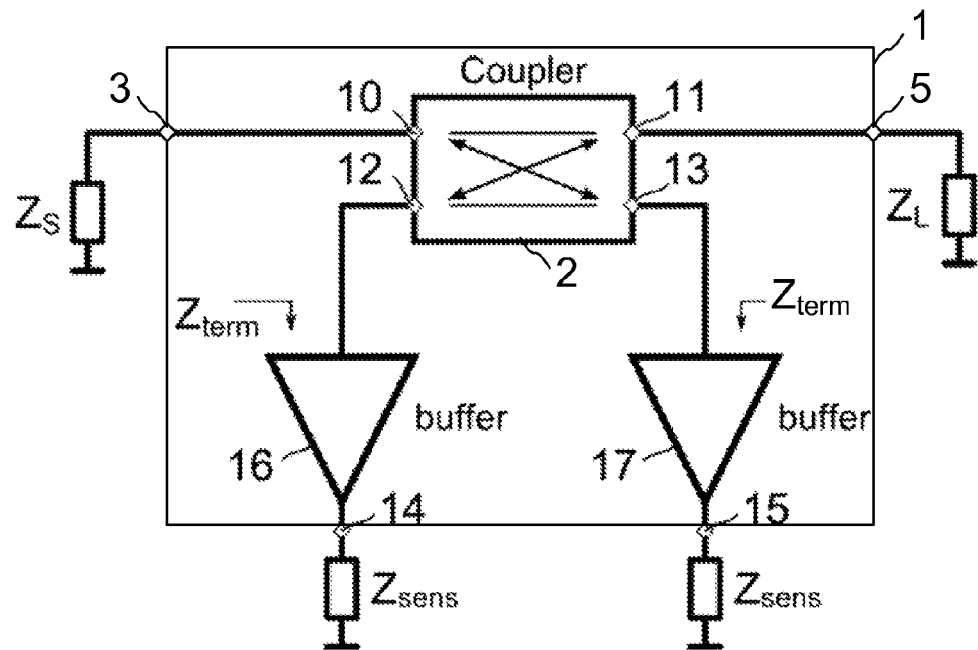
FIGS. 1a-d illustrate embodiment directional coupler circuits.

FIG. 1a illustrates directional coupler 1 according to an embodiment of the present invention. Directional coupler 1 includes coupler circuit 2, and RF amplifiers 16 and 17. Coupler circuit 2 is a directional coupler having coupler circuit input port 10, coupler circuit transmit port 11, coupler circuit isolated port 12 and coupler circuit coupled port 13. In some embodiments, coupler circuit 2 and amplifiers 16 and 17 reside on a common substrate, such as a semiconductor substrate, and may be implemented on a same integrated circuit. Coupler circuit 2 may be implemented using conventional directional coupler architectures such as, electromagnetic couplers, magnetic couplers constructed with magnetic transformers, or using other coupler architectures. For example, coupler circuit 2 may be implemented using a transformer and a phase shift network as described in U.S. patent application Ser. No. 13/931,092 entitled, "System and Method for a Transformer and a Phase-Shift Network" filed on Jun. 28, 2013, which application is incorporated herein by reference in its entirety.

In an embodiment, amplifier 16 is coupled between coupler circuit isolated port 12 and directional coupler isolated port 14, and amplifier 17 is coupled between coupler circuit coupled port 13 and directional coupler coupled port 15, such that coupler circuit input port 10, coupler circuit transmit port 11, directional coupler isolated port 14 and directional coupler coupled port 15 are coupled to external connections such as bond pads, bump bond connections and the like. As such, amplifiers 16 and 17 provide isolation form external impedance $Z_{sens}$, which represents of external circuitry coupled to directional coupler 1. This external circuit may be used, for example, to sense the incident and reflected waves in the RF path. If the external circuit, such as a power detector or other circuit is situated on a PCB board separate from directional coupler 1, impedance $Z_{sens}$ may vary significantly over frequency. This variation in impedance may be due to board capacitance of the PCB or other parasitic capacitances. By placing a buffer between coupler circuit isolated port 12 and directional coupler isolated port 14, and between coupler circuit coupled port 13 and directional coupler coupled port 15, coupler circuit isolated port 12 and coupler circuit coupled port 13 of coupler circuit 2 may be isolated, thereby reducing the sensitivity of the directivity of coupler circuit 2 to changes in impedance $Z_{sens}$. During operation, directional coupler 1 may be coupled to source impedance $Z_S$ via directional coupler input port 3 and to load impedance $Z_L$ via directional coupler transmit port 5.

In an embodiment, amplifiers 16 and 17 have input impedance $Z_{term}$, which may be used to provide an impedance match to coupler circuit isolated port 12 and to coupler circuit coupled port 13 of coupler circuit 2. This input impedance may be established, for example, by using an on-chip resistor coupled to a reference node such as ground, or by establishing the input impedance using feedback techniques known in the art. In some embodiments, $Z_{term}$ may be chosen to optimize the directivity of coupler circuit 2.

In embodiments, amplifiers 16 and 17 may be implemented using any suitable amplifier architecture and may be fully or partially integrated on the same substrate or die as coupler circuit 2. Amplifiers 16 and 17 may have a unity gain, a gain of less than one, or a gain of greater than one depending on the specification and requirements of the particular embodiment.

In some embodiments, the directivity of directional coupler 1 may be adjusted by varying the supply current of amplifier 16. For example, if amplifier 16 utilizes an architecture having an output impedance that is inversely proportional to the supply current, such as a source follower or emitter follower circuit, the decreased output impedance of the amplifier reduces the coupling from coupler circuit input port 10 or coupler circuit transmit port 11 to directional coupler isolated port 14. This is especially the case where directional coupler 1 is used to measure very small reflections under high signal conditions. Another way in which the directivity may be increased under such high signal conditions is by increasing the gain of amplifiers 16 and/or 17.

Figure 1B:
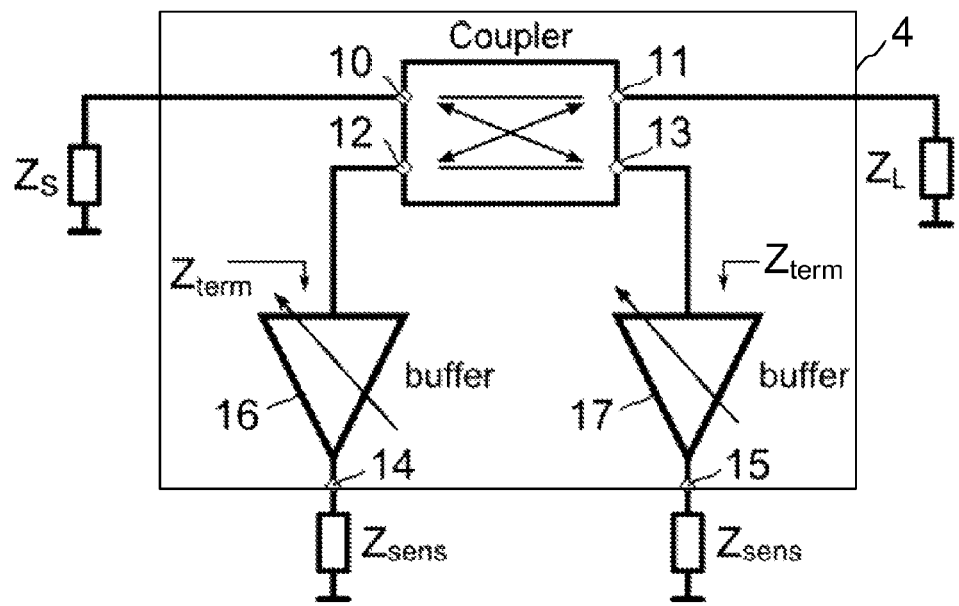

In some embodiments, the gain and/or current consumption of amplifiers 16 and/or 17 may be tuned as shown in FIG. 1b, which illustrates directional coupler 4 according to further embodiment of the present invention. Here the current consumption and/or gain of amplifiers 16 and 17 is variable and may be independently tunable. In some embodiments, amplifiers 16 and 17 may be disabled individually to offer power savings. To achieve high directivity and reduce the influence of parasitic coupling of RF signal into output nodes, the gain of the buffer at isolated port can be higher than the gain of the buffer at coupled port. To reduce signal compression in the buffer at high power levels, the gain of the buffer at coupled port can be adjusted using, for example, an automatic gain control (AGC) loop. As such, linearity of the coupled signal may be adjusted to minimize signal compression at high signal levels.

Figure 1C:
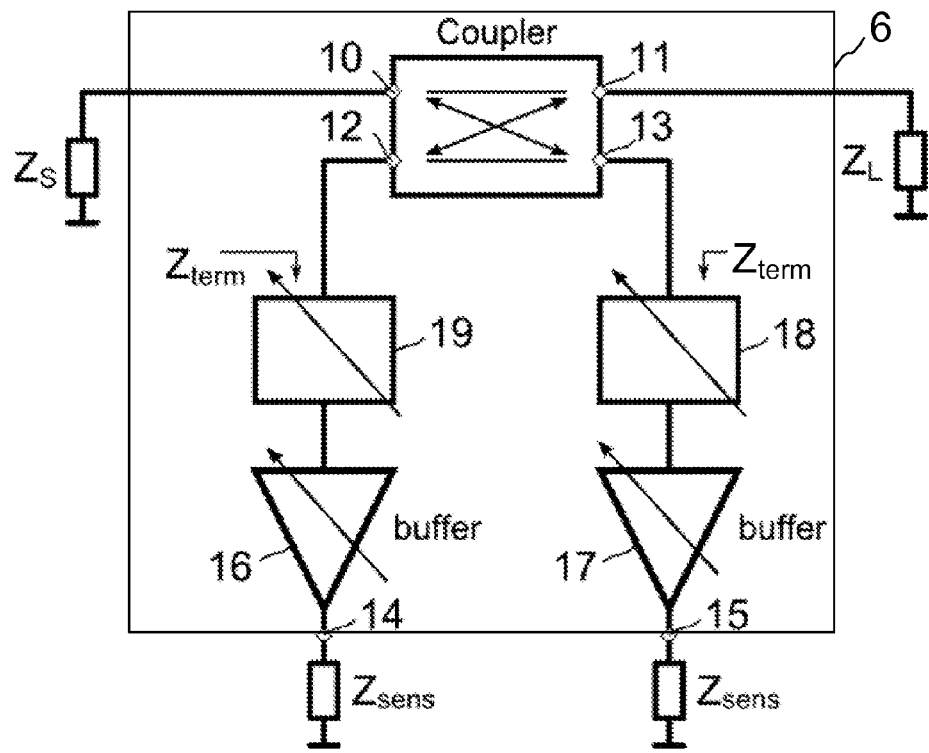

FIG. 1c illustrates embodiment directional coupler 6 in which tunable network 19 is coupled between coupler circuit isolated port 12 and the input of amplifier 16, and tunable network 19 is coupled between coupler circuit coupled port 13 and the input of amplifier 17. In an embodiment, tunable networks 18 and 19 may be used to adjust and/or optimize impedance $Z_{term}$ seen by coupler circuit isolated port 12 and coupler circuit coupled port 13. In some embodiments, tunable networks 18 and 19 may be implemented using tunable passive or active attenuators. In some embodiments, the attenuation of tunable networks 18 and 19 may be controlled as well as the gain of amplifiers 16 and 17 in the context of an AGC loop in order to extend the dynamic range of the system. In some embodiments, amplifiers 16 and 17 may be fixed gain amplifiers.

Figure 1D:
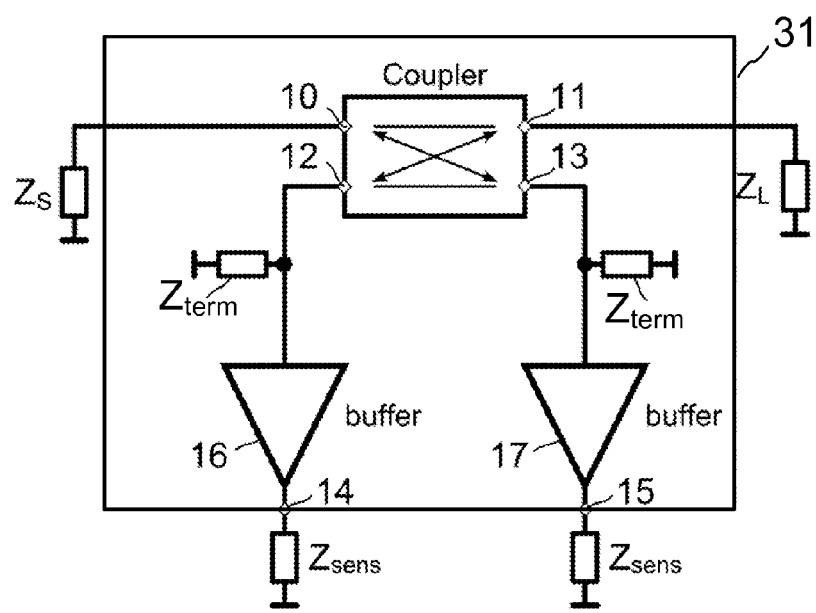

FIG. 1d illustrates embodiment directional coupler 31 in which termination impedances $Z_{term}$ are implemented using shunt impedances coupled to coupler circuit isolated port 12 and coupled circuit coupled port 13. It should be understood that the concept of using shunt impedances to implement impedances $Z_{term}$ may also be applied to other embodiments described herein.

Figure 2:
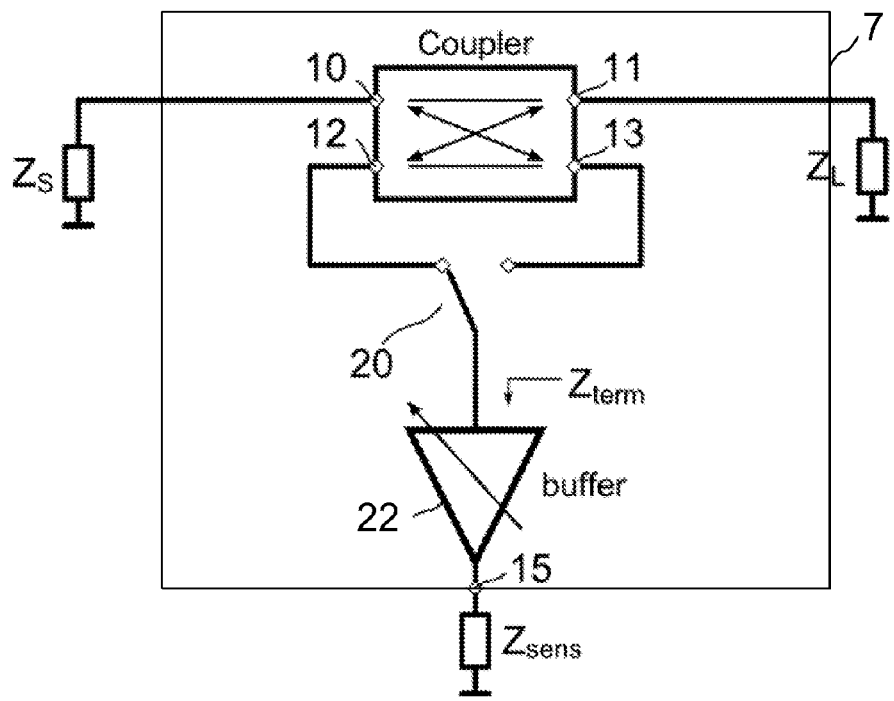
FIG. 2 illustrates an embodiment directional coupler with a switchable amplifier.

FIG. 2 illustrates directional coupler 7 according to a further embodiment of the present invention. Directional coupler 7 includes amplifier 22 that has an input that is selectively coupled between coupler circuit isolated port 12 and coupler circuit coupled port 13 of coupler circuit 2 via switch 20. By using a single amplifier 22, the design of directional coupler 7 may be made more compact. Moreover, enhanced gain matching between coupler circuit isolated port 12 and coupler circuit coupled port 13 may be achieved. In some embodiments, the gain of amplifier 22 may be adjustable and in other embodiments, the gain of amplifier 22 may be fixed. A tunable matching network (not shown), such as an attenuator may also be coupled to the input of amplifier 22.

Figure 3:
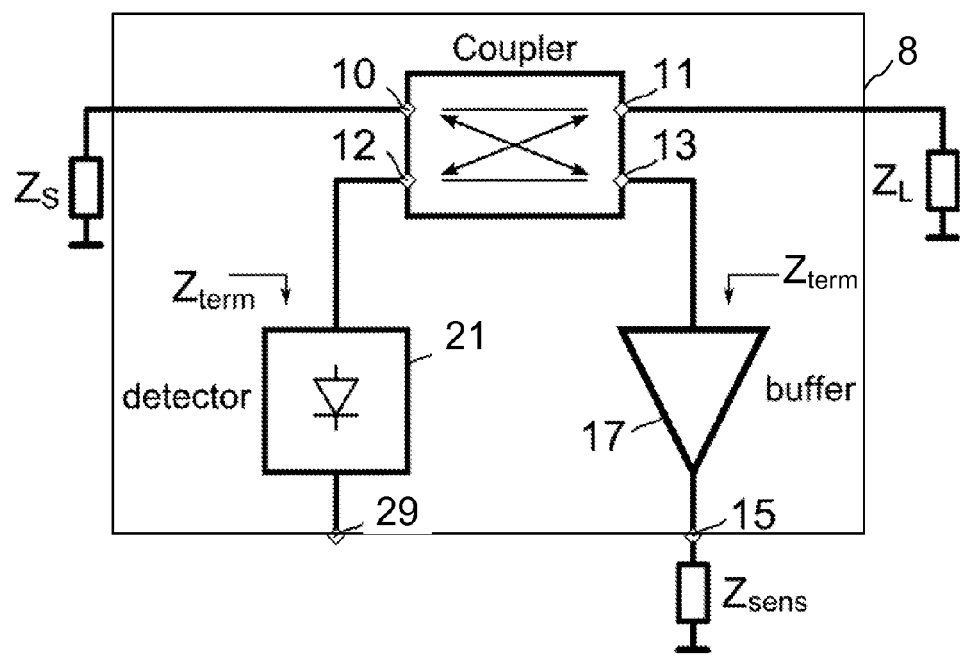
FIG. 3 illustrates an embodiment directional coupler with an RF power detector.

FIG. 3 illustrates directional coupler 8 according to another embodiment in which RF power detector 21 is coupled to coupler circuit isolated port 12. RF power detector 21 may be implemented using RF power detection circuits and systems known in the art. For example, RF power detector may be implemented using cascaded limiting amplifiers to achieve a linear or a log-linear output detection response. The output of RF power detector 21 is coupled to external output 29. In some embodiments, the output of RF power detector is a DC signal, the use of which may prevent coupled signals from coupler circuit input port 10 and coupler circuit transmit port 11 from degrading the apparent directivity of directional coupler 8. In some embodiments, RF power detector 21 may also include an analog-to-digital (A/D) converter that provides a digital signal at output 29 via a serial or parallel digital bus.

Figure 4A:
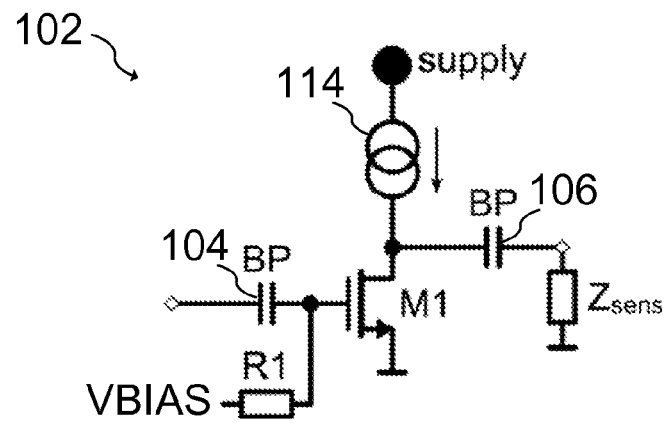
FIGS. 4a-c illustrate embodiment amplifiers.
Figure 4B:
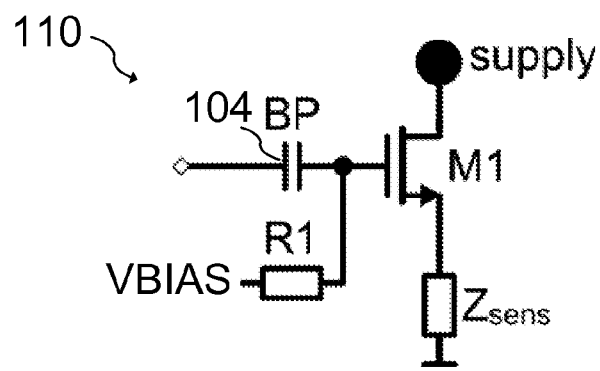
Figure 4C:
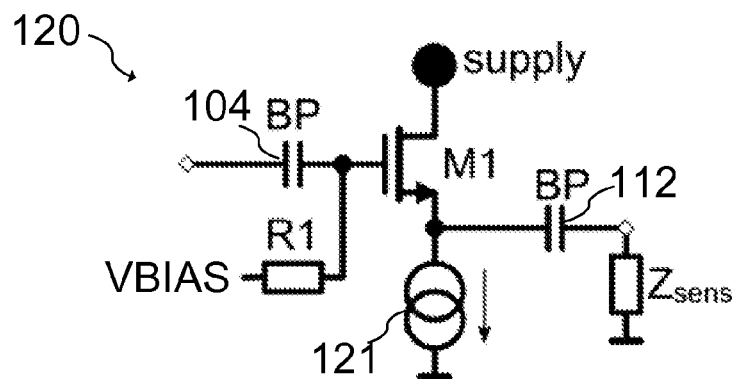

FIGS. 4a-c illustrate various amplifiers circuits that may be used to implement amplifiers 16 and 17 illustrated in FIGS. 1a-c, 2 and 3. FIG. 4a illustrates a common-source amplifier having NMOS transistor M1, input coupling capacitor 104, output coupling capacitor 106 and bias resistor R1. Current source 114, which may be implemented using a transistor-based current source, resistor, inductor, or other bias circuit, provides a bias current to NMOS transistor M1. In some embodiment, the gain of amplifier 102 may be adjusted by varying voltage VBIAS coupled to the gate of NMOS transistor M1 via bias resistor R1. In some embodiments, the voltage gain of amplifier 102 is proportional to bias voltage VBIAS. VBIAS may be generated using an on-chip bias generator or by applying an external bias signal to the gate of NMOS transistor M1.

FIG. 4b illustrates amplifier 110 in which NMOS transistor M1 is configured in a source follower configuration. Here, the source of transistor M1 is DC to load impedance $Z_{sens}$. In some embodiments, an additional biasing resistor (not shown) may be used to provide bias current in the case of a high output impedance or may be used to provide supplemental bias current. The bias current and hence the output impedance of NMOS transistor M1 may be adjusted by varying VBIAS. In some embodiments, increasing the bias current may provide increased directivity by lowering the impedance of source of NMOS transistor M1.

FIG. 4c illustrates amplifier 120 in which NMOS transistor M1 is configured in a source follower configuration and is coupled to output load impedance $Z_{sens}$ via coupling capacitor 112. Here, the bias current of NMOS transistor M1 may be adjusted by varying the current of current source 121 coupled to the source of NMOS transistor M1. Current source M1 may be implemented using current source structures known in the art. In some embodiments, current source 121 may be implemented by using a resistor, in which case the current of NMOS transistor M1 is adjustable by various VBIAS.

It should be understood the example amplifiers shown in FIGS. 4a-c are merely three examples of many possible embodiment amplifier implementations that may be used. In alternative embodiments, different circuit topologies and other circuits known in the art may be used. In further alternative embodiments, different transistor types may be used in place of NMOS transistor M1. For example, PMOS, JFET, BJT and other transistor types may be used instead or in addition to NMOS transistor M1. In embodiments that use BJT, common emitter and emitter follower circuits may be used to implement amplifiers 16 and 17.

Figure 5A:
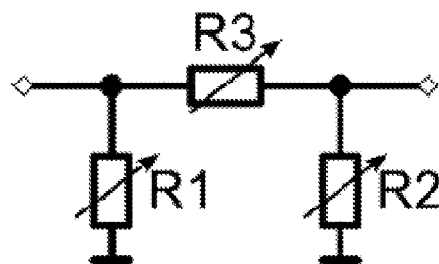
FIGS. 5a-c illustrate embodiment attenuators.
Figure 5B:
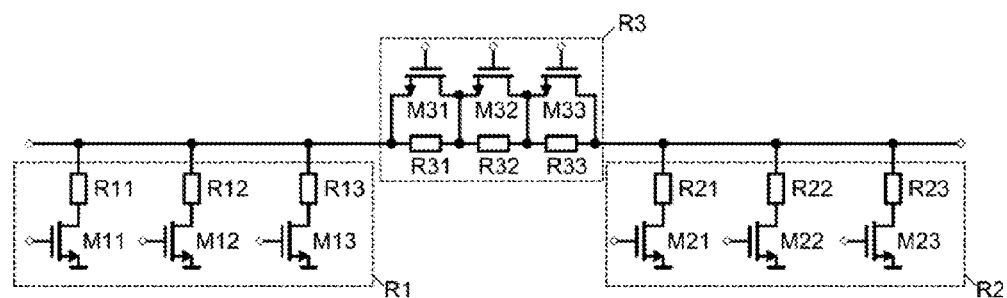
Figure 5C:
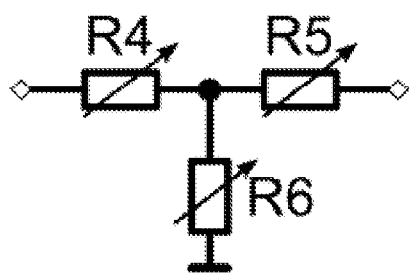

FIGS. 5a-c illustrate various embodiment adjustable attenuator circuits that may be used to implement tunable networks 18 and 19 shown, for example, in FIG. 1c. FIG. 5a illustrates PI attenuator having adjustable resistors R1, R2 and R2. These adjustable resistors may be implemented, for example, using the circuit illustrated in FIG. 5b. Here, resistor R1 is implemented using resistors R11, R12 and R13 that are coupled to NMOS switch transistors M11, M12 and M13 respectively. Similarly, resistor R2 is implemented using resistors R21, R22 and R23 that are coupled to NMOS switch transistors M21, M22 and M23 respectively. Resistor R3 is implemented using resistors R31, R32 and R33 that may be bypassed by NMOS switch transistors M31, M32 and M33 respectively. Hence, the attenuation and impedance of the PI network shown in FIGS. 5a-b may be adjusted by selectively activating and deactivating NMOS switching transistors M11, M12, M13, M21, M22, M23, M31, M32 and M33 via the gates of these transistors.

FIG. 5c illustrates an embodiment attenuator in the form of a T network using adjustable resistors R4, R5 and R6. Resistors R4 and R5 may be implemented in a similar manner as resistor R3 is implemented in FIG. 5b, and resistor R6 may be implemented similarly as resistors R1 and R2 are implemented in FIG. 5b. It should be understood that the attenuator circuits depicted in FIGS. 5a-c are just a few examples of the many possible embodiment attenuation circuits that may be used to implement adjustable networks 18 and 19.

Figure 6:
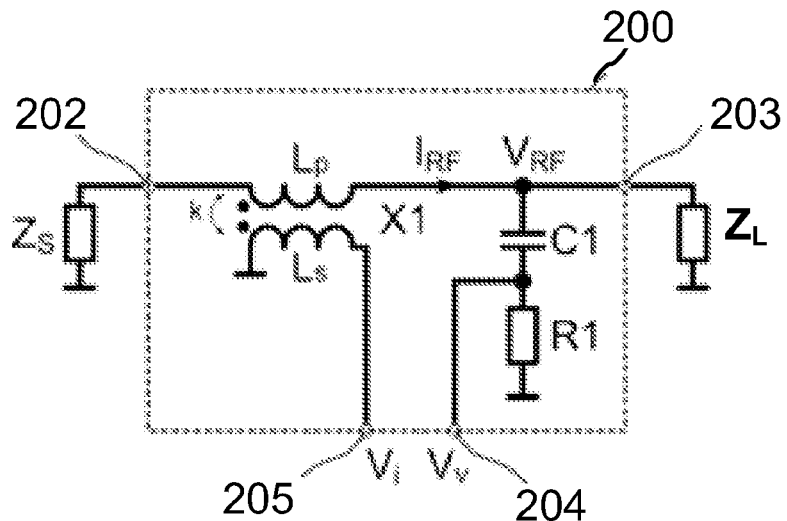
FIG. 6 illustrates a coupler circuit using a transformer and phase shifter.

FIG. 6 illustrates a coupler circuit 200 that may be used to implement coupler circuit 2 shown in FIGS. 1a-c, 2 and 3. Coupler circuit 200 is a four-port device with ports 202 and 203 being the 50-Ohm ports for an RF signal and two coupled ports 204 and 205 loaded with a high impedance. Alternatively, other characteristic impedances may be used for ports 202 and 203. Coupler 200 includes transformer X1 with primary winding Lp coupled between source impedance $Z_S$ and load impedance $Z_L$. A phase-shifting network implemented by a high-pass RC filter that includes resistor $R_1$ and capacitor $C_1$ is coupled to the port 203. Operation of such a network is described in "System and Method for a Transformer and a Phase-Shift Network" referenced above.

Figure 7:
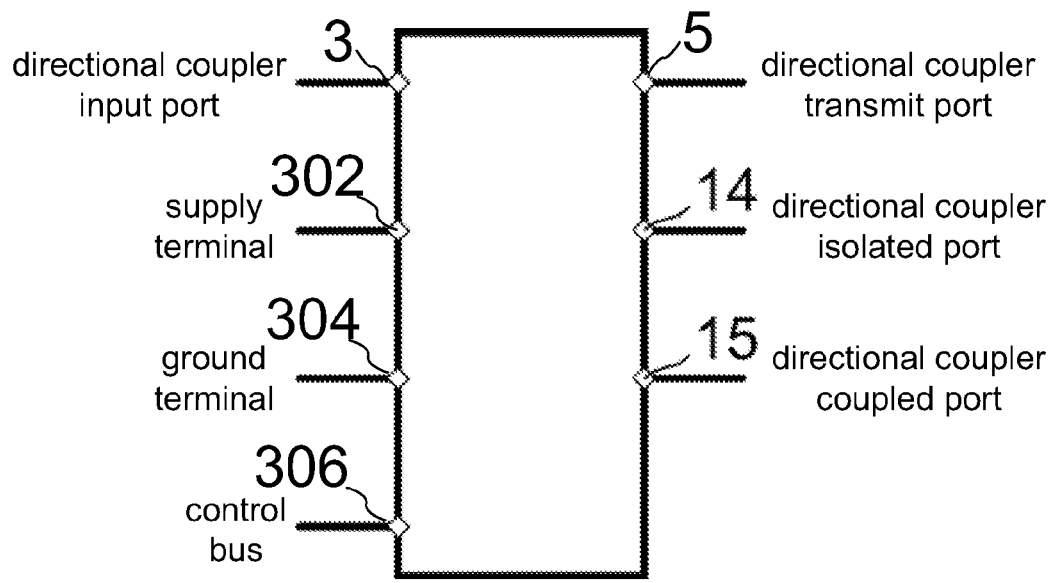
FIG. 7 illustrates an embodiment pin-out of an embodiment directional coupler package.

FIG. 7 illustrates a pinout diagram of an embodiment integrated circuit package. In an embodiment, an embodiment integrated circuit package includes pins or terminals for directional coupler circuit input port 3, directional coupler circuit transmit port 5, directional coupler isolated port 14 and directional coupler coupled port 15. In addition, some embodiment packages may include pins and terminals for a supply terminal 302, ground terminal 304 and control bus 306. Control bus 306 may be used to provide control signals to adjust the gain of amplifiers 16 and/or 17 and may also be used to adjust the attenuator of adjustable networks 18 and 19. Control bus may be implemented using a parallel or serial digital bus.

Figure 8A:
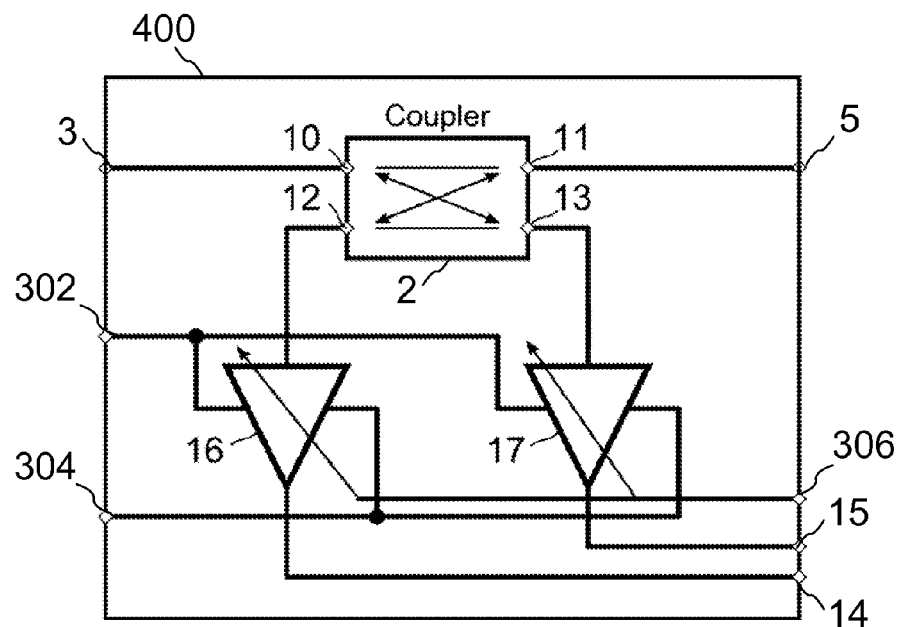
FIGS. 8a-b illustrate embodiment integrated circuits.
Figure 8B:
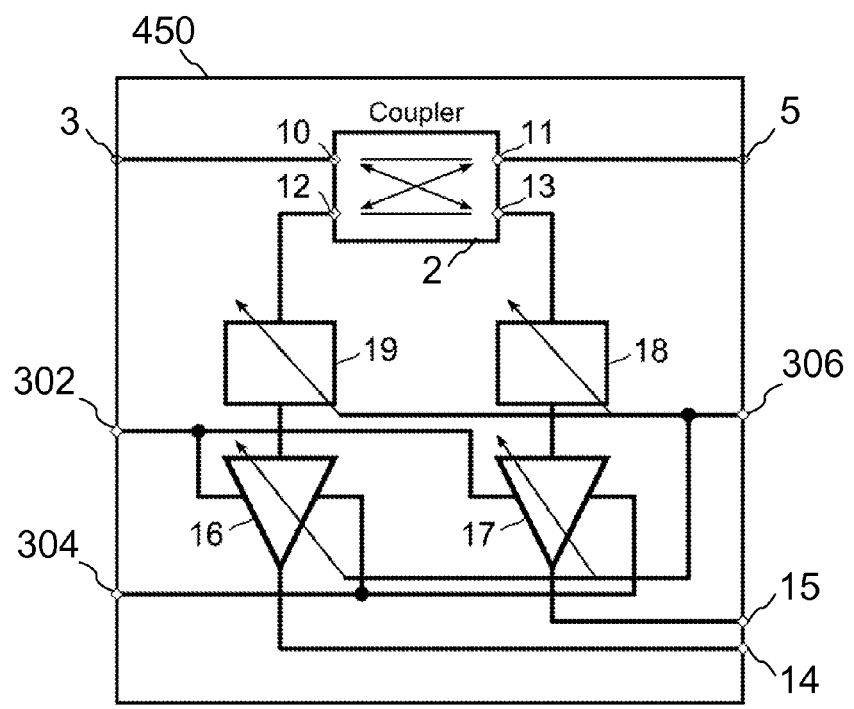

FIGS. 8a-b illustrate embodiment integrated circuits that may be used with the integrated circuit package illustrated in FIG. 7. In embodiment, integrated circuit 400 shown in FIG. 8a includes coupler circuit 2 having coupler circuit input port 10 coupled to directional coupler input port 3, coupler circuit transmit port 11 coupled to directional coupler transmit port 5. Integrated circuit 400 further includes RF amplifier 16 having an input coupled to coupler circuit isolated port 12 and an output coupler to directional coupler isolated port 14; and RF amplifier 17 having input coupled to coupler circuit coupled port 13 and an output coupled to directional coupler output port 15. Supply terminal 302 and ground terminal 304 provides power to RF amplifier 16 and RF amplifier 17. In an embodiment, RF amplifier 16 and RF amplifier 17 are implemented as variable gain amplifiers that are controllable via control bus 306.

Integrated circuit 450 illustrated in FIG. 8b is similar to integrated circuit 400 of 8a with the addition of tunable network 19 coupled between coupler circuit isolated port 12 and the input of RF amplifier 16; and tunable network 18 coupled between coupler circuit coupled port 13 and the input of RF amplifier 17.

Figure 9:
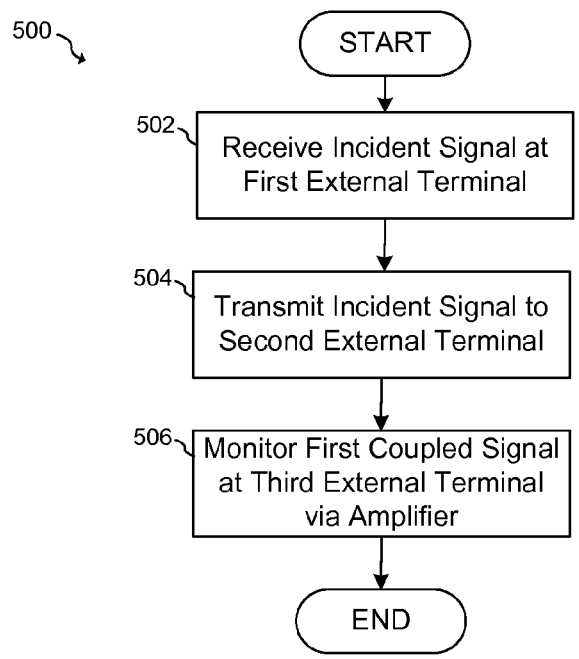
FIG. 9 illustrates a block diagram of an embodiment method.

FIG. 9 illustrates a block diagram 500 of a method of using an embodiment directional coupler. In an embodiment the directional coupler includes a directional coupler circuit disposed on a substrate, a first termination resistance disposed on the substrate and coupled to a first coupled output port of the directional coupler, a second termination resistance disposed on the substrate coupled to a second coupled output port of the directional coupler and a first amplifier coupled to at least one of the first coupled output port and the second coupled output port of the directional coupler circuit. In step 502, an incident signal is received at a first external terminal coupled to a first input port of the directional coupler circuit, and in step 504, the incident signal is transmitted at a second external terminal coupled to a first output port of the direction coupler circuit. In step 506, a first coupled signal is monitored at a third external terminal coupled to an output of the first amplifier. Alternatively, the monitoring of step 506 may be performed via a RF power detector instead of an amplifier. In some embodiments, method described by block diagram 500 may be implemented, for example, using the circuits shown in FIGS. 1a-c, 2 and 3.

In accordance with an embodiment, a directional coupler includes a coupler circuit and at least one amplifier coupled between a coupler circuit isolated port and a directional coupler isolated port and/or between a coupler circuit coupled port and a directional coupler coupled port. In various embodiments, the directional coupler is disposed over and/or in a substrate. The substrate may be a semiconductor substrate and/or the directional coupler may be implemented as a monolithic integrated circuit.

In an embodiment, the at least one amplifier includes a first amplifier coupled between the coupler circuit coupled port and the directional coupler coupled port. The at least one amplifier may further include a second amplifier coupled between the coupler circuit isolated port and the directional coupler isolated port. Moreover, the at least one amplifier may include a first amplifier coupled between the coupler circuit isolated port and the directional coupler isolated port and a second amplifier coupled between the coupler circuit coupled port and the directional coupler coupled port. In various embodiments, the at least one amplifier is an adjustable gain amplifier. The at least one amplifier may be implemented as a common source amplifier. In some embodiments, the directional coupler may also include a power detector coupled between the coupler circuit isolated port and a directional coupler isolated port.

In an embodiment, the directional further includes at least one internal termination impedance coupled to the coupler circuit coupling port and/or coupler circuit isolated port. In some cases, this termination impedance may be an adjustable impedance. The at least one amplifier may be coupled to the coupler circuit isolated port and/or coupler circuit coupled port through an impedance matching network, which, in some cases, may be an adjustable impedance matching network. In an embodiment, the at least one amplifier is coupled to the coupler circuit isolated port and/or coupler circuit coupled port through an attenuator that may be implemented as an adjustable integrated circuit.

In an embodiment, the coupler circuit includes a magnetic transformer and a phase shift network. The magnetic transformer has a first winding coupled between a coupler circuit input port and a coupler circuit transmit port, and a second winding coupled between a first reference node and the coupler circuit coupled port; and the a phase shift network is coupled between either the coupler circuit input port or the coupler circuit transmit port and the coupler circuit isolated port.

In accordance with another embodiment, a directional coupler includes a directional coupler input port, a directional coupler transmit port and a directional coupler output port. The directional coupler further includes a coupler circuit, and amplifier and a switch. The coupler circuit has a first coupler circuit input port, a first coupler circuit transmit port, a first coupler circuit isolated port and a first coupler circuit coupled port; the amplifier is coupled to the directional coupler output port; and the switch selectively coupler the amplifier to the coupler circuit coupled port and coupler circuit isolated port. In various embodiments, the directional coupler is disposed over and/or in a substrate, which may be a semiconductor substrate in some embodiments.

In an embodiment, the switch couples the amplifier to the coupler circuit coupled port and/or the switch couples the amplifier to the coupler circuit isolated port.

In accordance with a further embodiment, a method of operating a directional coupler includes various steps. The directional coupler includes a coupler circuit, and at least one amplifier coupled between a coupler circuit isolated port and a directional coupler isolated port and/or between a coupler circuit coupled port and a directional coupler coupled port. The method includes the steps of receiving an incident signal at a directional coupler input port coupled to a coupler circuit input port, transmitting the incident signal at a directional coupler transmit port coupled to a coupler circuit transmit port, and monitoring at least one signal at the directional coupler coupled port and/or the directional coupler isolated port.

In various embodiments, the monitoring the at least one signal includes monitoring a first signal at the directional coupler coupled port and/or measuring a reflection by monitoring an output of a power detector having an input coupled to the coupler circuit isolated port. In an embodiment, the monitoring the at least one signal includes monitoring a second signal at the directional coupler isolated port and in other various embodiments, the monitoring the at least one signal includes monitoring a first signal at the directional coupler coupled port and a second signal at the directional coupler isolated port. The at least one amplifier may include a first amplifier, and the method may further include the step of selectively coupling an input of the first amplifier to one of the coupler circuit coupled port and coupler circuit isolated port.

Figure 10:
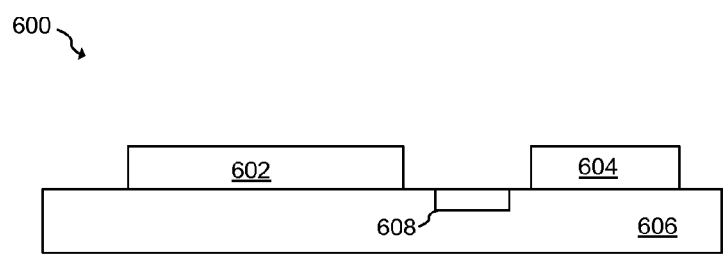
FIG. 10 illustrates an embodiment directional coupler implemented as various components disposed on and/or in a substrate.

FIG. 10 illustrates embodiment directional coupler 600 implemented as various components disposed on and/or in substrate 606. In an embodiment, coupler 602 and amplifier 604 are disposed on substrate 606. Component 608, which may be, for example, an embodiment termination impedance or other passive component, is shown disposed within substrate 606. In some embodiments, component 608 may be a separate component that is disposed on substrate 606 in a similar manner as coupler 602 and amplifier 604. Topologically, coupler 602, amplifier 604 and component 608 may be coupled according to the various directional coupler embodiments described herein. In some embodiments, amplifier 604 may be a single or may be multiple amplifiers disposed on one or more integrated circuits. Connections (not shown) to and from coupler 602, amplifier 604, component 608 and substrate 606 may be made using various connection methods known in the art. For example, such connections may be made using solder bumps, bond wires, bond pads, vias, redistribution lines, and the like. Substrate 606 may be implemented using a semiconductor substrate, a carrier substrate, a hybrid substrate, a printed circuit board (PCB) substrate and/or a substrate according to other substrate types known in the art. In some embodiments, coupler 600 may be encased within a molded package.

Advantages of embodiments of the present invention include high directivity that is independent from the quality of the external termination and/or parasitic RF coupling into the output interface nodes. Other advantages of some embodiments include tunable coupling factor and isolation, the ability to tradeoff between current consumption and coupling factor/isolation, as well as relaxed requirements of the load impedance at output ports.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A directional coupler comprising:
 a coupler circuit disposed on a monolithic integrated circuit (IC); and
 at least one amplifier disposed on the monolithic IC, the at least one amplifier coupled between a coupler circuit isolated port and a directional coupler isolated port and/ or between a coupler circuit coupled port and a directional coupler coupled port, wherein the directional coupler isolated port and the directional coupler coupled port each comprise an externally accessible terminal of the monolithic IC, and a directivity of the directional coupler is independent of an external termination coupled to the directional coupler isolated port or the directional coupler coupled port.

2. The directional coupler of claim 1, wherein the at least one amplifier includes a first amplifier coupled between the coupler circuit coupled port and the directional coupler coupled port.

3. The directional coupler of claim 2, further comprising a power detector coupled between the coupler circuit isolated port and a directional coupler isolated port.

4. The directional coupler of claim 1, wherein the at least one amplifier includes a second amplifier coupled between the coupler circuit isolated port and the directional coupler isolated port.

5. The directional coupler of claim 1, wherein the at least one amplifier includes a first amplifier coupled between the coupler circuit isolated port and the directional coupler isolated port and a second amplifier coupled between the coupler circuit coupled port and the directional coupler coupled port.

6. The directional coupler of claim 1, wherein the at least one amplifier is an adjustable gain amplifier.

7. The directional coupler of claim 1, further comprising at least one internal termination impedance coupled to the coupler circuit coupling port and/or coupler circuit isolated port.

8. The directional coupler of claim 7, wherein the at least one internal termination impedance is an adjustable impedance.

9. The directional coupler of claim 1, wherein the at least one amplifier is coupled to the coupler circuit isolated port and/or coupler circuit coupled port through an impedance matching network.

10. The directional coupler of claim 9 wherein the impedance matching network is an adjustable impedance matching network.

11. The directional coupler of claim 1, wherein the at least one amplifier is coupled to the coupler circuit isolated port and/or coupler circuit coupled port through an attenuator.

12. The directional coupler of claim 11 wherein the attenuator is an adjustable attenuator.

13. The directional coupler of claim 1, wherein the at least one amplifier is a common source amplifier.

14. The directional coupler of claim 1, wherein the coupler circuit comprises:
a magnetic transformer comprising a first winding coupled between a coupler circuit input port and a coupler circuit transmit port, and a second winding coupled between a first reference node and the coupler circuit coupled port; and
a phase shift network coupled between either the coupler circuit input port or the coupler circuit transmit port and the coupler circuit isolated port.

15. A directional coupler including a directional coupler input port, a directional coupler transmit port and a directional coupler output port, the directional coupler comprising:

a coupler circuit including a first coupler circuit input port, a first coupler circuit transmit port, a first coupler circuit isolated port and a first coupler circuit coupled port;
an amplifier coupled to the directional coupler output port; and
a switch selectively coupling an input of the amplifier to the coupler circuit coupled port and coupler circuit isolated port, wherein the coupler circuit, amplifier and switch are disposed on a monolithic integrated circuit and an output of the amplifier is coupled to an externally accessible terminal of the monolithic integrated circuit, and a directivity of the directional coupler is independent of an external termination coupled to the directional coupler output port.

16. The directional coupler of claim 15, wherein the switch couples the amplifier to the coupler circuit coupled port.

17. The directional coupler of claim 15, wherein the switch couples the amplifier to the first coupler isolated port.

18. The directional coupler of claim 15, wherein monolithic integrated circuit comprises a semiconductor substrate.

19. A method of operating a monolithic integrated circuit comprising a directional coupler including a coupler circuit, and at least one amplifier coupled between a coupler circuit isolated port and an externally accessible directional coupler isolated port and/or between a coupler circuit coupled port and an externally accessible directional coupler coupled port, the method comprising:
receiving an incident signal at an externally accessible directional coupler input port coupled to a coupler circuit input port;
transmitting the incident signal at an externally accessible directional coupler transmit port coupled to a coupler circuit transmit port; and
monitoring at least one signal at the externally accessible directional coupler coupled port and/or the externally accessible directional coupler isolated port, wherein a directivity of the directional coupler is independent of an external termination coupled to the externally accessible directional coupler isolated port or the externally accessible directional coupler coupled port.

20. The method of claim 19, wherein the monitoring the at least one signal includes monitoring a first signal at the externally accessible directional coupler coupled port.

21. The method of claim 20, further comprising measuring a reflection comprising monitoring an output of a power detector of the monolithic integrated circuit having an input coupled to the coupler circuit isolated port.

22. The method of claim 19, wherein the monitoring the at least one signal includes monitoring a second signal at the externally accessible directional coupler isolated port.

23. The method of claim 19, wherein the monitoring the at least one signal includes monitoring a first signal at the externally accessible directional coupler coupled port and a second signal at the externally accessible directional coupler isolated port.

24. The method of claim 19, wherein the at least one amplifier includes a first amplifier, the method further comprising selectively coupling an input of the first amplifier to one of the coupler circuit coupled port and coupler circuit isolated port.

* * * * *